(12) United States Patent
Yoon et al.

(10) Patent No.: US 9,748,243 B2
(45) Date of Patent: Aug. 29, 2017

(54) SEMICONDUCTOR DEVICE HAVING CONTACT PLUGS AND METHOD OF FORMING THE SAME

(71) Applicant: SAMSUNG ELECTRONICS CO., LTD., Suwon-si, Gyeonggi-do (KR)

(72) Inventors: Changseop Yoon, Yangsan-si (KR); Sungmin Kim, Daegu (KR); Chiwon Cho, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/049,721

(22) Filed: Feb. 22, 2016

(65) Prior Publication Data

US 2016/0315086 A1 Oct. 27, 2016

(30) Foreign Application Priority Data

Apr. 21, 2015 (KR) ........................ 10-2015-0056096

(51) Int. Cl.
| | |
|---|---|
| *H01L 21/70* | (2006.01) |
| *H01L 27/092* | (2006.01) |
| *H01L 27/088* | (2006.01) |
| *H01L 29/66* | (2006.01) |
| *H01L 29/06* | (2006.01) |
| *H01L 23/485* | (2006.01) |
| *H01L 29/165* | (2006.01) |

(52) U.S. Cl.
CPC ........ H01L 27/0924 (2013.01); H01L 23/485 (2013.01); H01L 27/0886 (2013.01); H01L 29/0653 (2013.01); H01L 29/665 (2013.01); H01L 29/165 (2013.01)

(58) Field of Classification Search
CPC H01L 27/0924; H01L 27/0886; H01L 23/528
USPC .......................................... 257/369
See application file for complete search history.

(56) References Cited

U.S. PATENT DOCUMENTS

| | | |
|---|---|---|
| 8,143,114 B2 | 3/2012 | Yu et al. |
| 8,653,630 B2 | 2/2014 | Liaw et al. |
| 2014/0131813 A1 | 5/2014 | Liaw |
| 2014/0191330 A1 | 7/2014 | Cheng et al. |

*Primary Examiner* — Anthony Ho
(74) *Attorney, Agent, or Firm* — Lee & Morse, P.C.

(57) ABSTRACT

A semiconductor device including a first fin active area substantially parallel to a second fin active area, a first source/drain in the first fin active area, a second source/drain in the second fin active area, a first contact plug on the first source/drain, and a second contact plug on the second source/drain. The center of the second contact plug is offset from the center of the second source/drain.

20 Claims, 12 Drawing Sheets

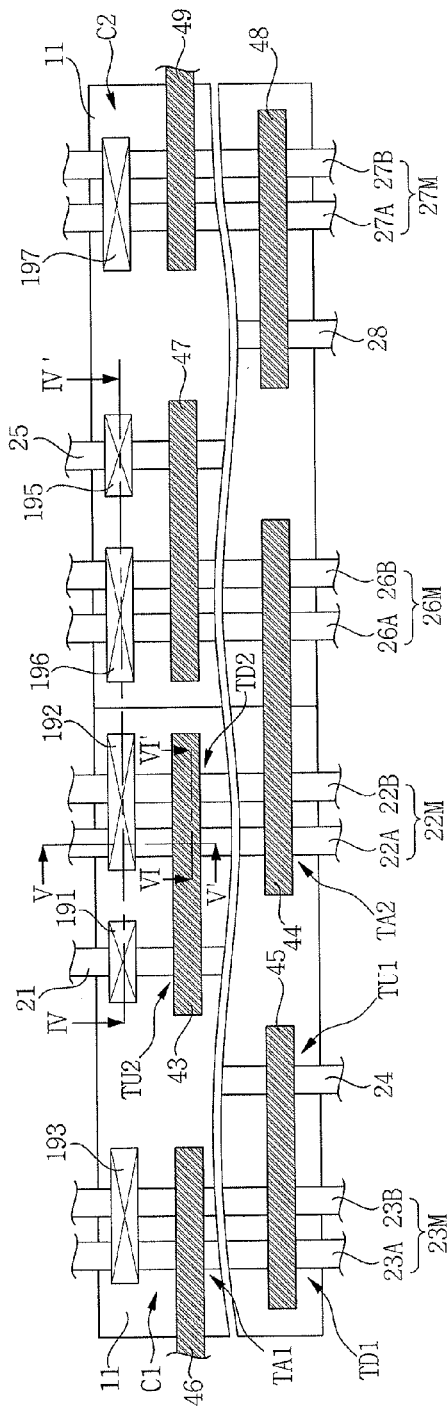
FIG.8
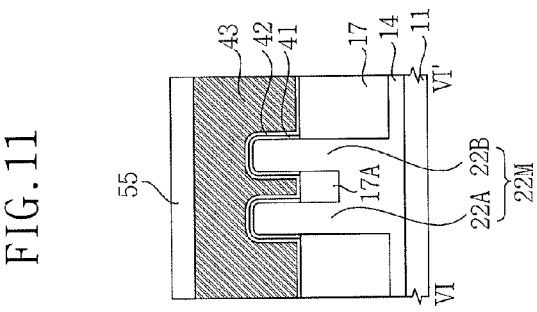
FIG.11
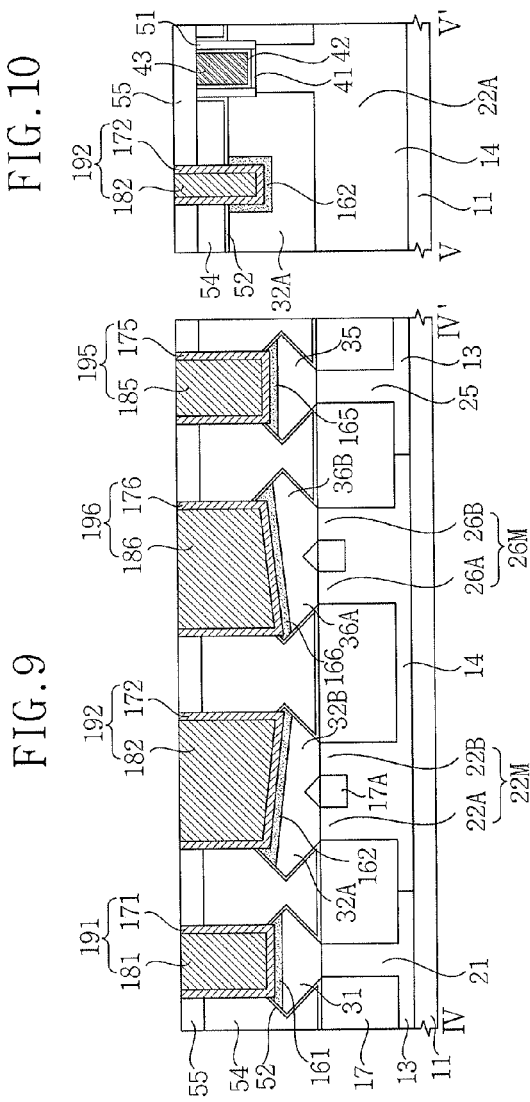
FIG.10
FIG.9

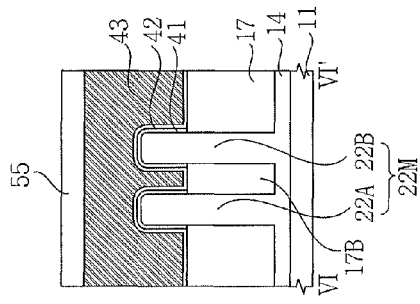
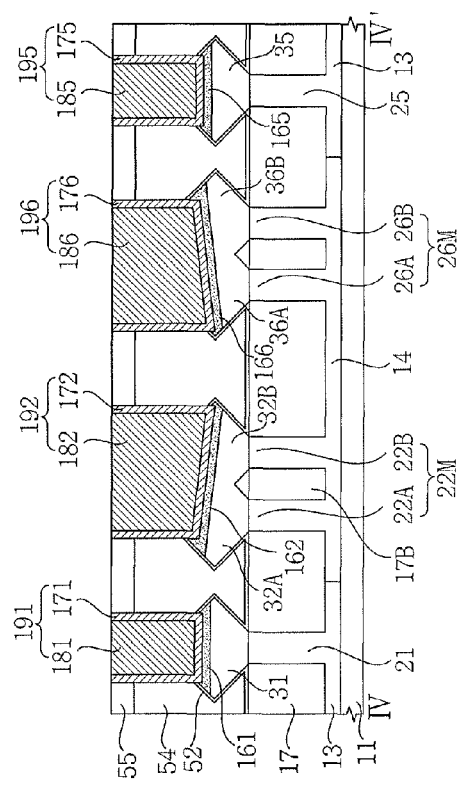
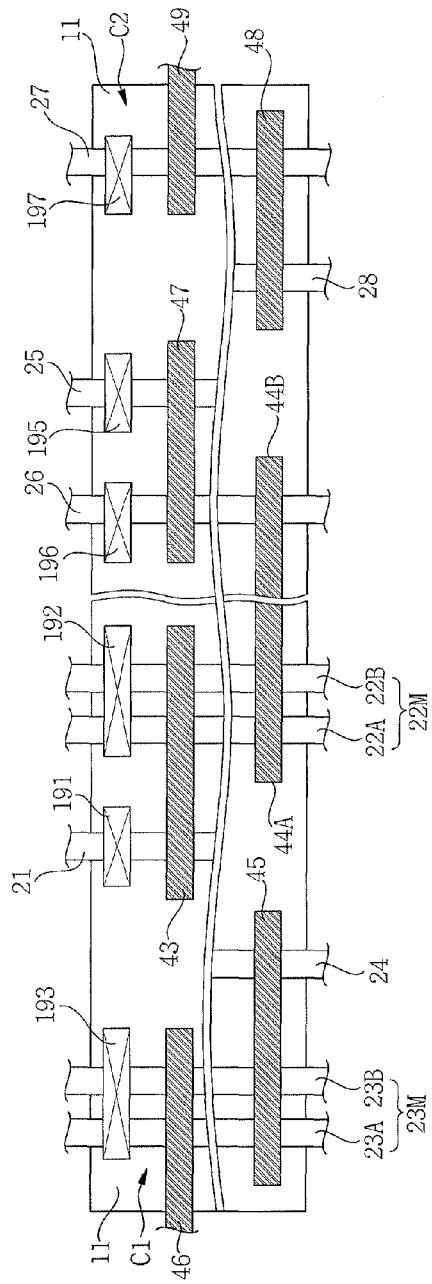

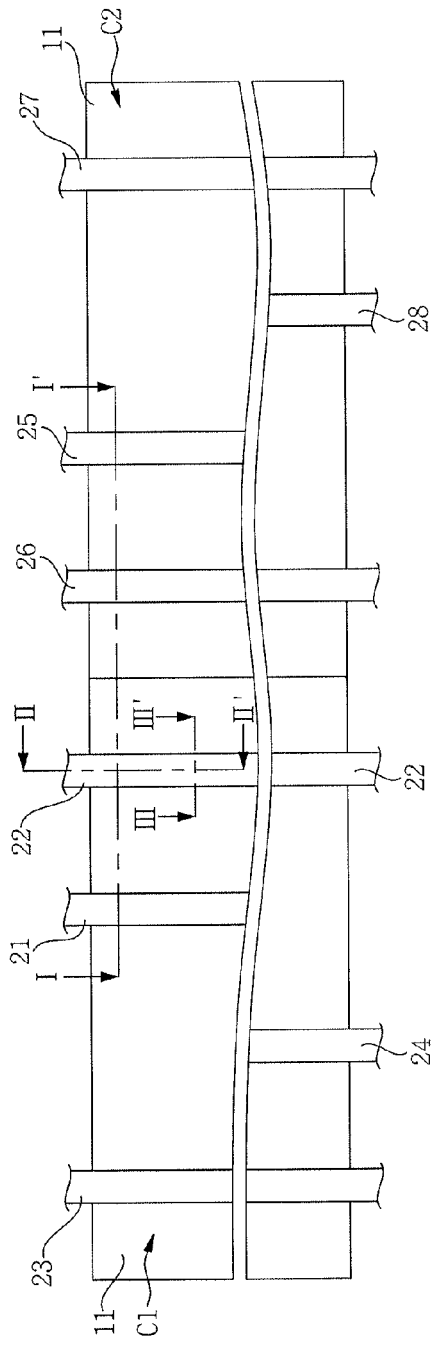
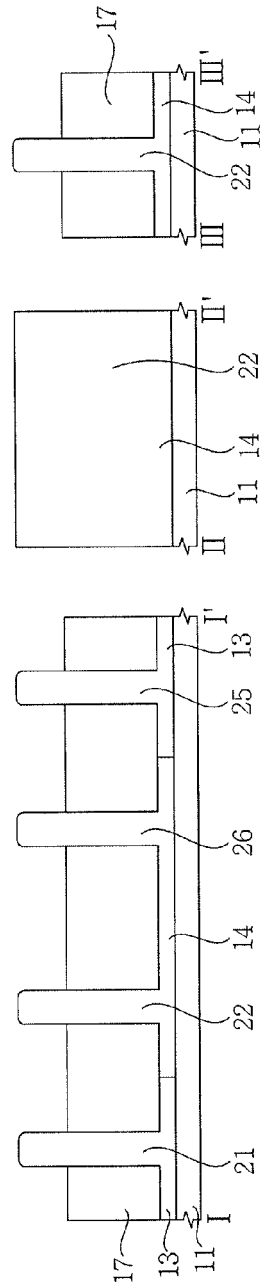

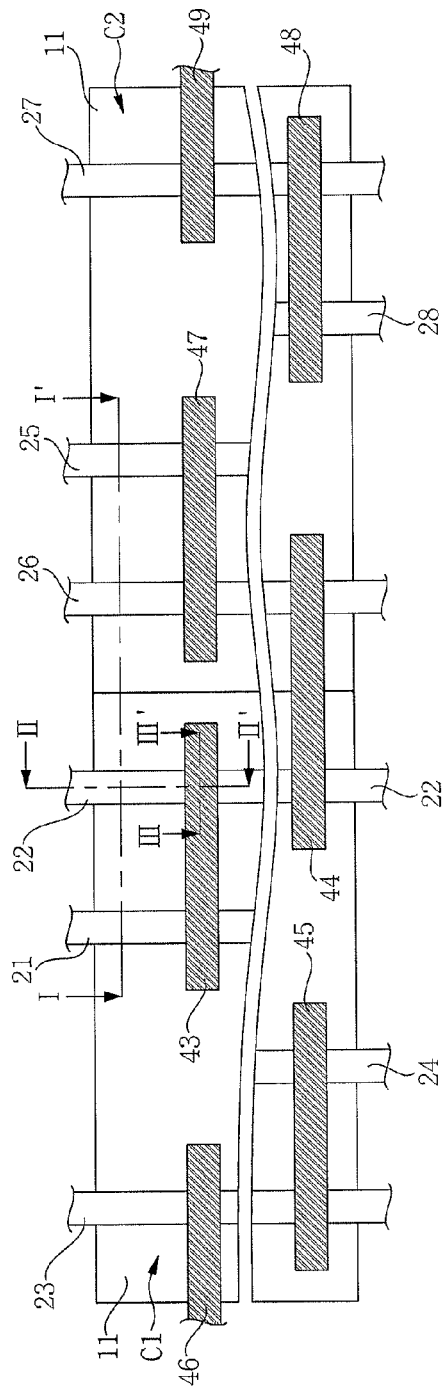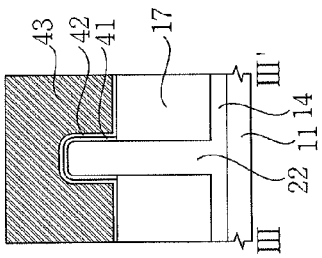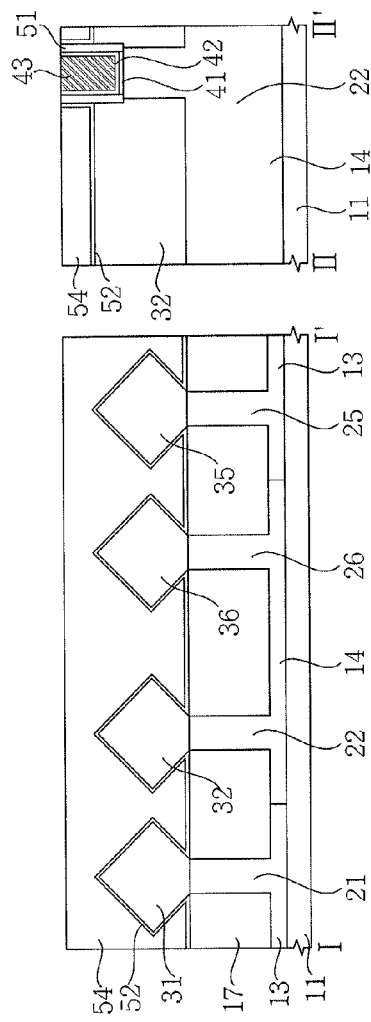

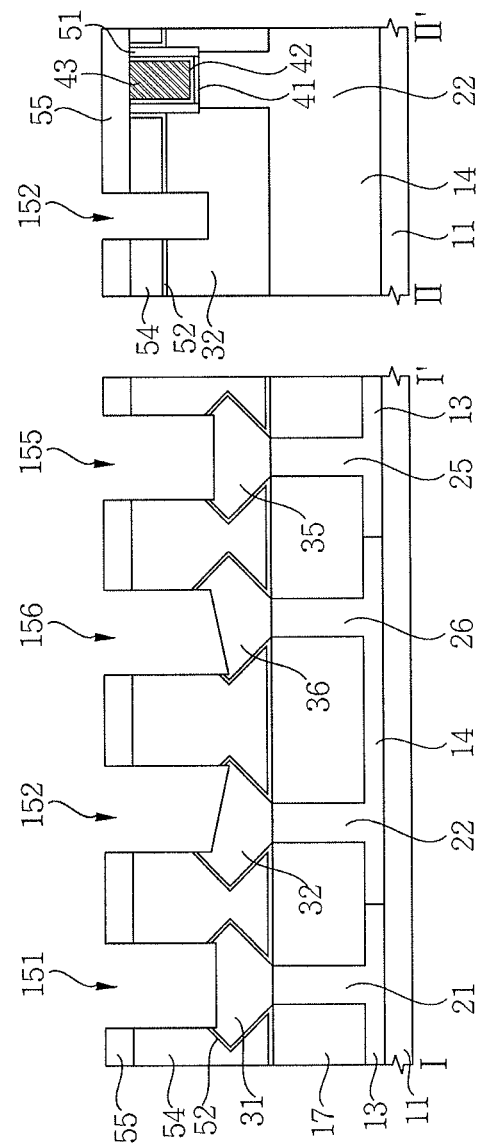

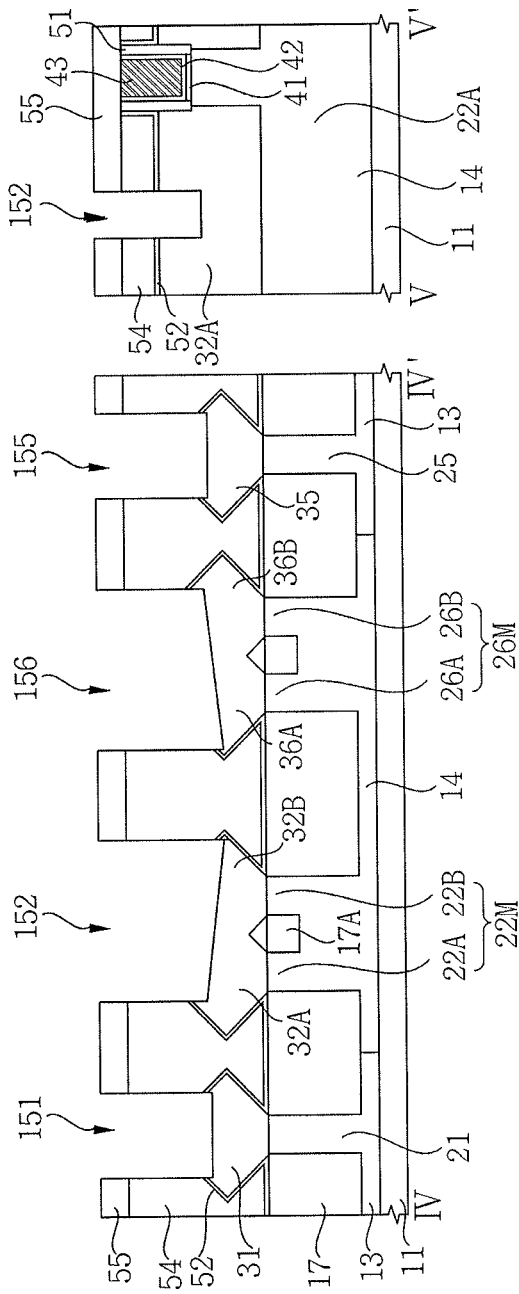

SEMICONDUCTOR DEVICE HAVING CONTACT PLUGS AND METHOD OF FORMING THE SAME

CROSS-REFERENCE TO RELATED APPLICATION

Korean Patent Application No. 10-2015-0056096, filed on Apr. 21, 2015, and entitled, "Semiconductor Device Having Contact Plugs and Method of Forming the Same," is incorporated by reference herein in its entirety.

BACKGROUND

1. Field

One or more embodiments herein relate to a semiconductor device having contact plugs and a method for forming a semiconductor device having contact plugs.

2. Description of the Related Art

As semiconductor devices become more highly integrated, it is increasingly difficult to form a plurality of contact plugs in a limited area. The contact plugs provide electrical connections between lower patterns and upper interconnections. The lower patterns have various intervals that configure a circuit. When contact plugs are formed on the lower patterns, various problems may arise, e.g., bridges may form between the contact plugs and/or an increase in leakage current may occur.

SUMMARY

In accordance with one or more embodiments, a semiconductor device includes a first fin active area; a second fin active area substantially parallel to the first fin active area; a first source/drain in the first fin active area; a second source/drain in the second fin active area; a first contact plug on the first source/drain; and a second contact plug on the second source/drain, wherein a center of the second contact plug is offset from a center of the second source/drain. A bottom of the second contact plug may have a different inclination from a bottom of the first contact plug.

The semiconductor device may include an inclined interface between the second contact plug and the second source/drain, and the inclined interface may be at a higher level in a direction approaching the first fin active area and at a lower level in a direction away from the first fin active area. A distance between a vertical center of the first contact plug and a vertical center of the second contact plug may be greater than a distance between a vertical center of the first source/drain and a vertical center of the second source/drain. A lower end of the second contact plug may be at a lower level than a lower end of the first contact plug. A horizontal width of the first source/drain may be greater than a horizontal width of the first fin active area, and a horizontal width of the second source/drain may be greater than a horizontal width of the second fin active area.

The semiconductor device may include a metal silicide layer between the second contact plug and the second source/drain, and a farthest point of an interface between the second contact plug and the second source/drain from a vertical line passing through a center of the first source/drain may be at a lower level than a closest point of the interface between the second contact plug and the second source/drain to the vertical line passing through the center of the first source/drain.

The semiconductor device may include a third fin active area substantially parallel to the second fin active area; a third source/drain in the third fin active area; and a third contact plug on the third source/drain, wherein the second fin active area is between the first fin active area and the third fin active area, and wherein a center of the third contact plug is offset from a center of the third source/drain.

A distance between the second fin active area and the third fin active area may be greater than a distance between the first fin active area and the second fin active area. A distance between a vertical center of the second contact plug and a vertical center of the third contact plug may be less than a distance between a vertical center of the second source/drain and a vertical center of the third source/drain.

In accordance with one or more other embodiments, a semiconductor device includes first and second pull-up transistors; first and second pull-down transistors; first and second access transistors; a first contact plug adjacent to the second pull-up transistor; and a second contact plug adjacent to the second pull-down transistor, wherein a first source/drain in a first fin active area of the second pull-up transistor is connected to the first contact plug, a second source/drain in a second fin active area of the second pull-down transistor is connected to the second contact plug, and a center of the second contact plug is offset from a center of the second source/drain. The second fin active area may be substantially parallel to the first fin active area.

The first source/drain may include P-type impurities and the second source/drain may include N-type impurities. The first source/drain may include a crystal-growth SiGe layer, and the second source/drain may include a crystal-growth Si layer, a crystal-growth SiC layer, or a combination thereof.

A distance between a vertical center of the first contact plug and a vertical center of the second contact plug may be greater than a distance between a vertical center of the first source/drain and a vertical center of the second source/drain. A bottom of the second contact plug may have a different inclination from a bottom of the first contact plug. The semiconductor device may include an inclined interface between the second contact plug and the second source/drain, and the inclined interface may be at a higher level in a direction approaching the first fin active area and at a lower level in a direction away from the first fin active area.

In accordance with one or more other embodiments, a semiconductor device a multi-fin active area; a fin active area substantially parallel to the multi-fin active area; a source/drain in the fin active area; a multi-source/drain in the multi-fin active area; a first contact plug on the source/drain; and a second contact plug on the multi-source/drain, and a center of the second contact plug is offset from a center of the multi-source/drain. The multi-fin active area may include a first sub-fin active area substantially parallel to a second sub-fin active area, and the multi-source/drain may include a first multi-source/drain on the first sub-fin active area and a second multi-source/drain on the second sub-fin active area. The second multi-source/drain may directly contact the first multi-source/drain.

The semiconductor device may include an inclined interface between the second contact plug and the multi-source/drain, the inclined interface at a higher level in a direction approaching the fin active area and at a lower level in a direction away from the fin active area. A distance between a vertical center of the first contact plug and a vertical center of the second contact plug may be greater than a distance between a vertical center of the source/drain and a vertical center of the multi-source/drain.

The semiconductor device may include a metal silicide layer between the second contact plug and the multi-source/drain, wherein a farthest point of an interface between the second contact plug and the metal silicide layer from a vertical line passing through a center of the source/drain is at a lower level than a closest point of the interface between the second contact plug and the metal silicide layer to the vertical line passing through the center of the source/drain.

In accordance with one or more other embodiments, a semiconductor device includes first and second pull-up transistors; first and second pull-down transistors; first and second access transistors; a first contact plug adjacent to the second pull-up transistor; and a second contact plug adjacent to the second pull-down transistor, wherein a source/drain formed in a fin active area of the second pull-up transistor is connected to the first contact plug, a multi-source/drain formed in a multi-fin active area of the second pull-down transistor is connected to the second contact plug, and center of the second contact plug is offset from a center of the multi-source/drain. The multi-fin active area may include first sub-fin active area substantially parallel to a second sub-fin active area, and the multi-source/drain may include a first multi-source/drain on the first sub-fin active area and a second multi-source/drain on the second sub-fin active area.

In accordance with one or more other embodiments, a semiconductor device includes a first source/drain area; a second source/drain area; a first contact plug on the first source/drain area; and a second contact plug on the second source/drain area, wherein the first contact plug has a center substantially aligned with a center of the first source/drain area and wherein a center of the second contact plug is offset from a center of the second source/drain.

The first contact plug may be adjacent the second contact plug. The center of the first contact plug may be spaced from the center of the second contact plug by a first distance; the center of the first source/drain area may be spaced from the center of the second source/drain area by a second distance; and the first distance may be greater than the second distance. A lower surface of at least one of the first or second contact plugs may be inclined. lower surface of the first contact plug may have a first shape; a lower surface of the second contact plug may have a second shape; and the first shape may be different from the second shape.

BRIEF DESCRIPTION OF THE DRAWINGS

Features will become apparent to those of skill in the art by describing in detail exemplary embodiments with reference to the attached drawings in which:

FIG. 8 illustrates another layout embodiment of a semiconductor device;

FIGS. 9-11 illustrate sectional views of the semiconductor device in FIG. 8;

FIGS. 12-13 illustrate another embodiment of a semiconductor device;

FIG. 14 illustrates another layout embodiment of a semiconductor device;

FIGS. 15 and 19 illustrate embodiments of a method for forming a semiconductor device;

FIGS. 16-18 and 20-24 illustrate views for embodiments of the method of FIGS. 15 and 19, respectively;

FIGS. 25-32 illustrate views for another embodiment of a method for forming a semiconductor device.

DETAILED DESCRIPTION

Figure 3:
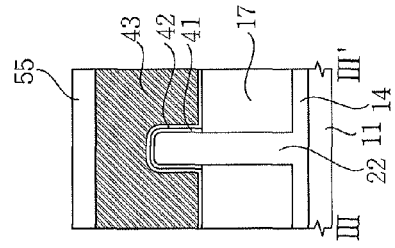
FIGS. 1-3 illustrate an embodiment of a semiconductor device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The terminology used herein to describe the embodiments is not intended to limit the scope of the invention. The use of the singular form in the present document should not preclude the presence of more than one referent. In other words, elements of the embodiments referred to in the singular form may number one or more, unless the context clearly indicates otherwise. It will be further understood that the terms "comprises," "comprising," "includes," and/or "including" used herein specify the presence of stated elements, components, steps, operations, and/or devices, but do not preclude the presence or addition of one or more other elements, components, steps, operations, and/or devices.

It will be understood that when an element is referred to as being "connected to" or "coupled to" another element, it can be directly connected to or coupled to the other element or an intervening element may be present. In contrast, when an element is referred to as being "directly connected to" or "directly coupled to" another element, there are no intervening elements present. In the following explanation, the same reference numerals denote the same components throughout the specification. As used herein, the term "and/or" includes each and all combinations of at least one of the referred to items.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation. In addition, the device may be reoriented in other ways and the descriptors used herein should be interpreted accordingly.

Embodiments are described herein with reference to cross-sectional and/or planar illustrations that are schematic illustrations of idealized embodiments and intermediate structures. In the drawings, the sizes and relative sizes of layers and regions may be exaggerated for clarity. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the actual shape of a region of a device and are not intended to limit the scope of the present embodiments.

Terms such as "front side" and "back side" may be used in a relative sense herein to facilitate easy understanding of the embodiments. Accordingly, "front side" and "back side" may not refer to any specific direction, location, or component, and may be used interchangeably. For example, "front side" may be interpreted as "back side" and vice versa. Also, "front side" may be expressed as "first side," and "back side" may be expressed as "second side," and vice versa. However, "front side" and "back side" cannot be used interchangeably in the same embodiment.

The term "near" is intended to mean that one among two or more components is located within relatively close proximity of a certain other component. For example, it should be understood that when a first end is near a first side, the first end may be closer to the first side than a second end, or the first end may be closer to the first side than to a second side.

Figure 2:
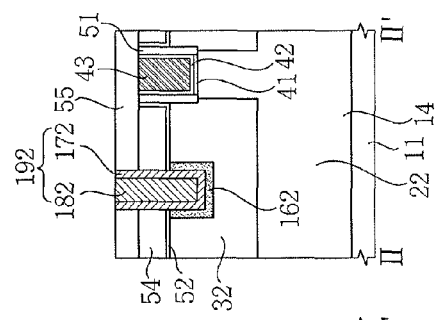
Figure 1:
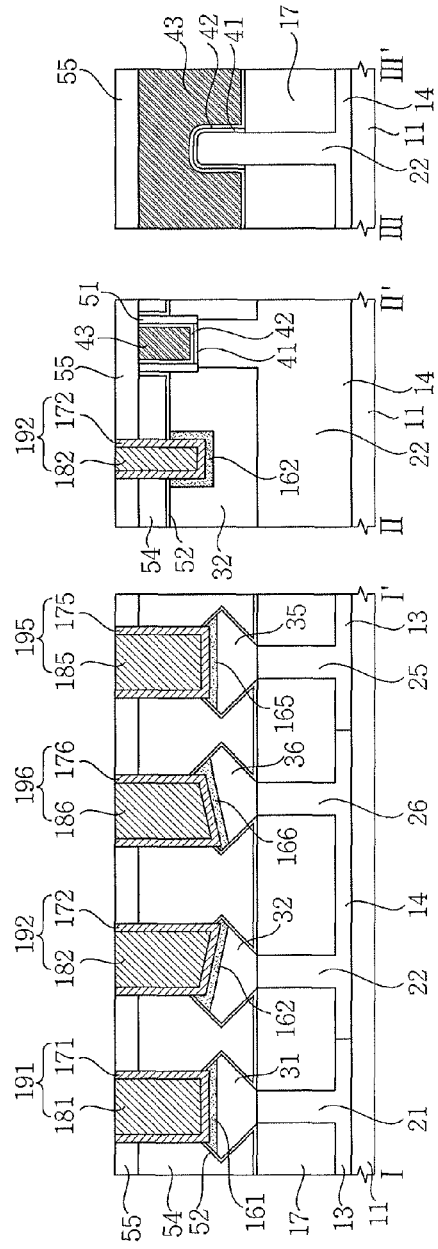
Figure 4:
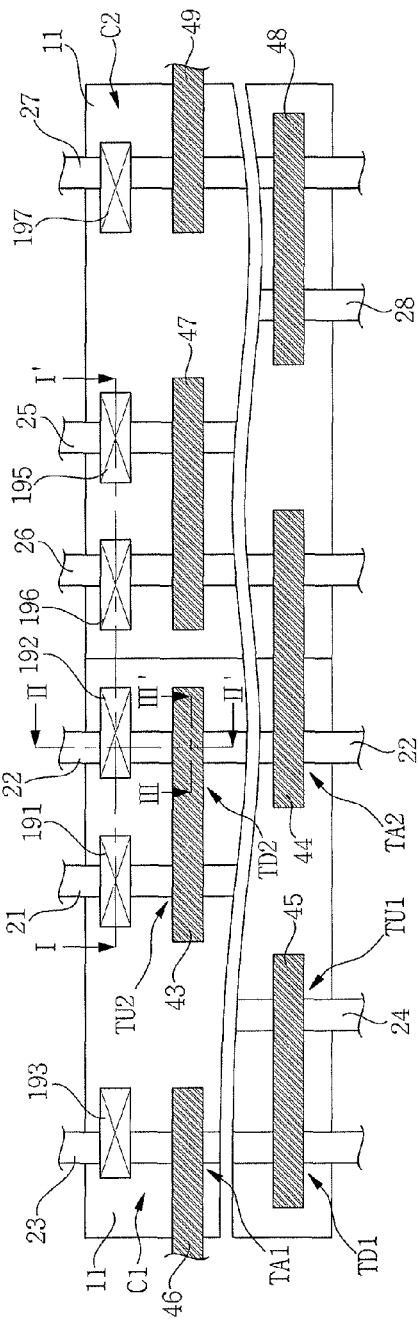
FIG. 4 illustrates a layout embodiment of the semiconductor device.

FIGS. 1 to 3 illustrate different cross-sectional views of an embodiment of a semiconductor device, and FIG. 4 illustrates a layout embodiment of the semiconductor device. In particular, FIG. 1 illustrates a cross-sectional view taken along line I-I' in FIG. 4. FIG. illustrates a cross-sectional view taken along line II-II' in FIG. 4. FIG. 3 illustrates a cross-sectional view taken along line III-III' in FIG. 4.

Referring to FIG. 1, an N-well 13, a P-well 14, a device isolation layer 17, fin active areas 21, 22, 25, and 26, source/drain areas 31, 32, 35, and 36, an etch-stop layer 52, a lower insulating layer 54, an upper insulating layer 55, metal silicide layers 161, 162, 165, and 166 barrier layers 171, 172, 175, and 176, and conductive layers 181, 182, 185, and 186 are formed on a substrate 11. The barrier layers 171, 172, 175, and 176 and the conductive layers 181, 182, 185, and 186 may configure contact plugs 191, 192, 195, and 196.

Referring to FIG. 2, the P-well 14, the fin active area 22, the source/drain area 32, a lower gate dielectric layer 41, an upper gate dielectric layer 42, a gate electrode 43, spacers 51, the etch-stop layer 52, the lower insulating layer 54, the upper insulating layer 55, the metal silicide layer 162, the barrier layer 172, and the conductive layer 182 may be formed on the substrate 11.

Referring to FIG. 3, the P-well 14, the device isolation layer 17, the fin active area 22, the lower gate dielectric layer 41, the upper gate dielectric layer 42, the gate electrode 43, and the upper insulating layer 55 may be formed on the substrate 11.

Referring to FIG. 4, fin active areas, gate electrodes, and contact plugs are on the substrate 11. The substrate 11 includes a first cell region C1 and a second cell region C2. The fin active areas include a first fin active area 21, a second fin active area 22, a third fin active area 23, a fourth fin active area 24, a fifth fin active area 25, a sixth fin active area 26, a seventh fin active area 27, and an eighth fin active area 28. The gate electrodes include a first gate electrode 43, a second gate electrode 44, a third gate electrode 45, a fourth gate electrode 46, a fifth gate electrode 47, a sixth gate electrode 48, and a seventh gate electrode 49. The contact plugs include a first contact plug 191, a second contact plug 192, a third contact plug 193, a fourth contact plug 195, a fifth contact plug 196, and a sixth contact plug 197.

A first access transistor TA1 may be formed at an intersection of the third fin active area 23 and the fourth gate electrode 46. A pull-down transistor TD1 may be formed at an intersection of the third fin active area 23 and the third gate electrode 45. A first pull-up transistor TU1 may be formed at an intersection of the fourth fin active area 24 and the third gate electrode 45. A second access transistor TA2 may be formed at an intersection of the second fin active area 22 and the second gate electrode 44. A second pull-down transistor TD2 may be formed at an intersection of the second fin active area 22 and the first gate electrode 43. A second pull-up transistor TU2 may be formed at an intersection of the first fin active area 21 and the first gate electrode 43.

Figure 5:
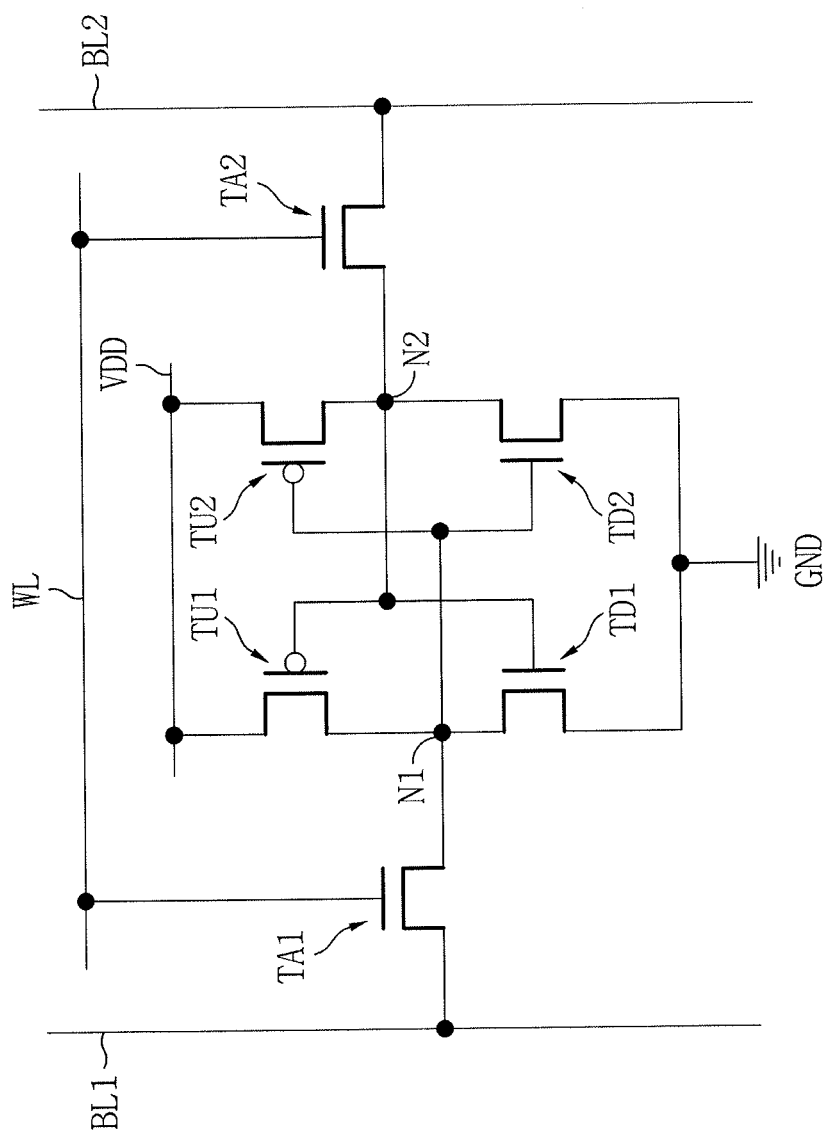
FIG. 5 illustrates an equivalent circuit for the semiconductor device.

FIG. 5 is an equivalent circuit diagram for the semiconductor device. The equivalent circuit may correspond to a CMOS SRAM cell. The first cell region C1 in FIG. 4 may be interpreted as including the CMOS SRAM cell in FIG. 5. The second cell region C2 in FIG. 4 may also be interpreted as including a configuration similar to the CMOS SRAM cell in FIG. 5.

Referring to FIG. 5, the CMOS SRAM cell may include a pair of pull-up transistors TU1 and TU2, a pair of pull-down transistors TD1 and TD2, and a pair of access transistors TA1 and TA2. The pair of pull-down transistors TD1 and TD2 and the pair of access transistors TA1 and TA2 may be NMOS transistors, and the pair of pull-up transistors TU1 and TU2 may be PMOS transistors.

The first pull-down transistor TD1 and the first access transistor TA1 may be connected in series. A source of the first pull-down transistor TD1 may be electrically connected to a ground GND. A drain of the first access transistor TA1 may be electrically connected to a first bit line BL1.

The second pull-down transistor TD2 and the second access transistor TA2 may be connected in series. A source of the second pull-down transistor TD2 may be electrically connected to the ground GND. A drain of the second access transistor TA2 may be electrically connected to a second bit line BL2.

The source and drain of first pull-up transistor TU1 may be electrically connected to a power source VDD and a drain of the first pull-down transistor TD1, respectively. The source and a drain of the second pull-up transistor TU2 may be electrically connected to the power source VDD and a drain of the second pull-down transistor TD2. The drain of the first pull-up transistor TU1, the drain of the first pull-down transistor TD1, and a source of the first access transistor TA1 may correspond to a first node N1. In addition, the drain of the second pull-up transistor TU2, the drain of the second pull-down transistor TD2, and a source of the second access transistor TA2 may correspond to a second node N2.

A gate electrode of the first pull-down transistor TD1 and a gate electrode of the first pull-up transistor TU1 may be electrically connected to the second node N2. A gate electrode of the second pull-down transistor TD2 and a gate electrode of the second pull-up transistor TU2 may be electrically connected to the first node N1. Gate electrodes of the first and second access transistors TA1 and TA2 may be electrically connected to a word line WL.

Referring again to FIGS. 1 to 4, the substrate 11 may be a semiconductor substrate, e.g., a silicon wafer or a silicon-on-insulator SOI wafer. In one embodiment, the substrate 11 may be a single crystalline silicon wafer including P-type impurities. The N-well 13 and the P-well 14 may be formed in the substrate 11. For example, the N-well 13 may be a silicon layer including N-type impurities, and the P-well 14 may be a silicon layer including P-type impurities. When the substrate 11 is a single crystalline silicon wafer including P-type impurities, the P-well 14 may be omitted.

The fin active areas 21, 22, 23, 24, 25, 26, 27, and 28 may be defined on the substrate 11 by the device isolation layer 17. Each of the fin active areas 21, 22, 23, 24, 25, 26, 27, and 28 may have, for example, a line shape or a bar shape in a plan view. Each of the fin active areas 21, 22, 23, 24, 25, 26, 27, and 28 may have a vertical height greater than a horizontal width. The device isolation layer 17 may include an insulating layer which includes, for example, silicon oxide, silicon nitride, silicon oxynitride, or a combination thereof.

The first fin active area 21, the fourth fin active area 24, the fifth fin active area 25, and the eighth fin active area 28 may be formed in the N-well 13. The first fin active area 21, the fourth fin active area 24, the fifth fin active area 25, and the eighth fin active area 28 may be a silicon layer including N-type impurities. The second fin active area 22, the third fin active area 23, the sixth fin active area 26, and the seventh fin active area 27 may be formed in the P-well 14. The second fin active area 22, the third fin active area 23, the sixth fin active area 26, and the seventh fin active area 27 may be a silicon layer including P-type impurities.

The second cell region C2 may be adjacent to the first cell region C1. The first to fourth fin active areas 21, 22, 23, and 24 may be in the first cell region C1. The fifth to eighth fin active areas 25, 26, 27, and 28 may be in the second cell region C2. The first fin active area 21 may be parallel to the second fin active area 22. The fourth fin active area 24 may be parallel to the third fin active area 23. An extension of the first fin active area 21 may be parallel to the fourth fin active area 24. The first fin active area 21 may be between the second fin active area 22 and the third fin active area 23.

The fifth fin active area 25 may be parallel to the sixth fin active area 26. The eighth fin active area 28 may be parallel to the seventh fin active area 27. An extension of the fifth fin active area 25 may be parallel to the eighth fin active area 28. The fifth fin active area 25 may be between the sixth fin active area 26 and the seventh fin active area 27. The second fin active area 22 may be between the first fin active area 21 and the sixth fin active area 26. The sixth fin active area 26 may be parallel to the second fin active area 22. The sixth fin active area 26 may be between the second fin active area 22 and the fifth fin active area 25.

The distance between the first fin active area 21 and the second fin active area 22 may be less than the distance between the second fin active area 22 and the sixth fin active area 26. The distance between the second fin active area 22 and the sixth fin active area 26 may be greater than the distance between the fifth fin active area 25 and the sixth fin active area 26.

Each of the gate electrodes 43, 44, 45, 46, 47, 48, and 49 may include a work-function metal layer and a conductive layer. The first gate electrode 43 may cross the first fin active area 21 and the second fin active area 22. The second gate electrode 44 may cross the second fin active area 22 and the sixth fin active area 26. The third gate electrode 45 may cross the third fin active area 23 and the fourth fin active area 24. The fourth gate electrode 46 may cross the third fin active area 23. The fifth gate electrode 47 may cross the fifth fin active area 25 and the sixth fin active area 26. The sixth gate electrode 48 may cross the seventh fin active area 27 and the eighth fin active area 28. The seventh gate electrode 49 may cross the seventh fin active area 27.

The lower gate dielectric layer 41 and the upper gate dielectric layer 42 may be between the gate electrodes 43, 44, 45, 46, 47, 48, and 49 and the fin active areas 21, 22, 23, 24, 25, 26, 27, and 28. For example, the lower gate dielectric layer 41 may be between the second fin active area 22 and the first gate electrode 43. The lower gate dielectric layer 41 may be in direct contact with upper and side surfaces of the second fin active area 22. The upper gate dielectric layer 42 may be on the lower gate dielectric layer 41. The upper gate dielectric layer 42 may be in direct contact with the bottom and side surfaces of the first gate electrode 43. The first gate electrode 43 may cover the upper and side surfaces of the second fin active area 22. A lower end of the first gate electrode 43 may be at a lower level than an upper end of the second fin active area 22.

The lower gate dielectric layer 41 may include a chemical oxide formed in a cleaning process. The lower gate dielectric layer 41 may include silicon oxide formed, for example, by a reaction of $H_2O_2$ and Si. The lower gate dielectric layer 41 may be referred to as an interfacial oxide. The upper gate dielectric layer 42 may include one or more high-k dielectrics. The upper gate dielectric layer 42 may include, for example, HfO, HfSiO, or a combination thereof.

The spacers 51 may be on side surfaces of each of the gate electrodes 43, 44, 45, 46, 47, 48, and 49. For example, the spacers 51 may cover side surfaces of the first gate electrode 43. The upper gate dielectric layer 42 may be between the first gate electrode 43 and the spacer 51. The spacer 51 may include an insulating layer which includes, for example, silicon oxide, silicon nitride, silicon oxynitride, or a combination thereof.

The source/drain areas 31, 32, 35, and 36 may be in the fin active areas 21, 22, 23, 24, 25, 26, 27, and 28 adjacent to the gate electrodes 43, 44, 45, 46, 47, 48, and 49. Each of the source/drain areas 31, 32, 35, and 36 may include a crystal growth material. Lower ends of the source/drain areas 31, 32, 35, and 36 may be formed at a lower level than upper ends of the fin active areas 21, 22, 23, 24, 25, 26, 27, and 28. Upper ends of the source/drain areas 31, 32, 35, and 36 may be formed at a higher level than the upper ends of the fin active areas 21, 22, 23, 24, 25, 26, 27, and 28. The horizontal width of each of the source/drain areas 31, 32, 35, and 36 may be greater than the horizontal width of each of the fin active areas 21, 22, 23, 24, 25, 26, 27, and 28. Each of the source/drain areas 31, 32, 35, and 36 may be vertically aligned on a corresponding one of the fin active areas 21, 22, 23, 24, 25, 26, 27, and 28.

For example, a first source/drain area 31 may be in the first fin active area 21. The first source/drain area 31 may include, for example, SiGe, Si, or a combination thereof, formed by a selective epitaxial growth (SEG) method. The first source/drain area 31 may include a SiGe layer including P-type impurities.

A second source/drain area 32 may be in the second fin active area 22. The second source/drain area 32 may include, for example, SiC, Si, or a combination thereof, formed by an SEG method. The second source/drain area 32 may include a Si layer including N-type impurities.

A third source/drain area 35 may be in the fifth fin active area 25. The third source/drain area 35 may include, for example, SiGe, Si, or a combination thereof, formed by an SEG method. The third source/drain area 35 may include a SiGe layer including P-type impurities.

A fourth source/drain area 36 may be in the sixth fin active area 26. The fourth source/drain area 36 may include, for example, SiC, Si, or a combination thereof, formed by an SEG method. The fourth source/drain area 36 may include a Si layer including N-type impurities.

The distance between the first source/drain area 31 and the second source/drain area 32 may be less than the distance between the second source/drain area 32 and the fourth source/drain area 36. The distance between the second source/drain area 32 and the fourth source/drain area 36 may be greater than the distance between the third source/drain area 35 and the fourth source/drain area 36.

The etch-stop layer 52 may be on the source/drain areas 31, 32, 35, and 36. The etch-stop layer 52 may conformally cover the source/drain areas 31, 32, 35, and 36, the device isolation layer 17, and the spacer 51. The etch-stop layer 52 may include an insulating layer which includes, for example, silicon oxide, silicon nitride, silicon oxynitride, or a combination thereof. The lower insulating layer 54 may be on the etch-stop layer 52. Upper ends of the lower insulating layer 54, the etch-stop layer 52, the spacer 51, the upper gate dielectric layer 42, and the first gate electrode 43 may be substantially coplanar. The lower insulating layer 54 may include an insulating layer, e.g., silicon oxide, silicon nitride, silicon oxynitride, or a combination thereof.

The etch-stop layer 52 may include a material having an etch selectivity with respect to the lower insulating layer 54. For example, the lower insulating layer 54 may include a tetraethyl orthosilicate (TEOS) layer, and the etch-stop layer 52 may include a silicon nitride layer. The upper insulating layer 55 may be on the lower insulating layer 54. The upper insulating layer 55 may cover the lower insulating layer 54, the etch-stop layer 52, the spacer 51, the upper gate dielectric layer 42, and the first gate electrode 43. The upper insulating layer 55 may include an insulating layer, e.g., silicon oxide, silicon nitride, silicon oxynitride, or a combination thereof.

Each of the contact plugs 191, 192, 193, 195, 196, and 197 may pass through the upper insulating layer 55, the lower insulating layer 54, and the etch-stop layer 52. Bottom surfaces, i.e., surfaces facing corresponding source/drain regions, adjacent contact plugs may have different inclinations from one another, e.g., bottom surfaces may be included in relation to a vertical line passing orthogonally through the contact plugs. The first contact plug 191 may be on the first source/drain area 31 to be adjacent to the first gate electrode 43. The first contact plug 191 may include a first conductive layer 181 and a first barrier layer 171 surrounding the bottom and side surfaces of the first conductive layer 181. A first metal silicide layer 161 may be between the first contact plug 191 and the first source/drain area 31. A center of the first contact plug 191 may be vertically aligned on a center of the first source/drain area 31.

The second contact plug 192 may be on the second source/drain area 32 to be adjacent to the first gate electrode 43. The second contact plug 192 may include a second conductive layer 182 and a second barrier layer 172 surrounding the bottom and side surfaces of the second conductive layer 182. A second metal silicide layer 162 may be between the second contact plug 192 and the second source/drain area 32. The center of the second contact plug 192 may be offset from the center of the second source/drain area 32. The distance between the center of the first source/drain area 31 and the center of the second source/drain area 32 may be less than the distance between the center of the first contact plug 191 and the center of the second contact plug 192.

An inclined interface may be between the second contact plug 192 and the second source/drain area 32. The bottom of the second contact plug 192 may have a different inclination from the bottom of the first contact plug 191. The bottom of the second contact plug 192 may be at a lower level in a direction away from a vertical line passing through the center of the first contact plug 191.

The lower end of the second contact plug 192 may be at a lower level than a lower end of the first contact plug 191. The bottom of the second contact plug 192 may be at a higher level in a direction approaching the vertical line passing through the center of the first contact plug 191.

A point at the highest level of the bottom of the second contact plug 192 may be at a higher level than a point at the highest level of the bottom of the first contact plug 191. A lower end of the second metal silicide layer 162 may be at a lower level than a lower end of the first metal silicide layer 161.

The fourth contact plug 195 may be on the third source/drain area 35 to be adjacent to the fifth gate electrode 47. The fourth contact plug 195 may include a fourth conductive layer 185 and a fourth barrier layer 175 surrounding the bottom and side surfaces of the fourth conductive layer 185. A fourth metal silicide layer 165 may be between the fourth contact plug 195 and the third source/drain area 35. The center of the fourth contact plug 195 may be vertically aligned on the center of the third source/drain area 35.

The fifth contact plug 196 may be on the fourth source/drain area 36 to be adjacent to the fifth gate electrode 47. The fifth contact plug 196 may include a fifth conductive layer 186 and a fifth barrier layer 176 surrounding the bottom and side surfaces of the fifth conductive layer 186. A fifth metal silicide layer 166 may be between the fifth contact plug 196 and the fourth source/drain area 36. The center of the fifth contact plug 196 may be offset from the center of the fourth source/drain area 36. The distance between the center of the third source/drain area 35 and the center of the fourth source/drain area 36 may be less than the distance between the center of the fourth contact plug 195 and the center of the fifth contact plug 196.

An inclined interface may be between the fifth contact plug 196 and the fourth source/drain area 36. The bottom of the fifth contact plug 196 may have a different inclination from the bottom of the fourth contact plug 195. The bottom of the fifth contact plug 196 may be at a lower level in a direction away from a vertical line passing through the center of the fourth contact plug 195. A lower end of the fifth contact plug 196 may be at a lower level than a lower end of the fourth contact plug 195. The bottom of the fifth contact plug 196 may be at a higher level in a direction approaching the vertical line passing through the center of the fourth contact plug 195.

A point at the highest level of the bottom of the fifth contact plug 196 may be at a higher level than a point at the highest level of the bottom of the fourth contact plug 195. A lower end of the fifth metal silicide layer 166 may be at a lower level than a lower end of the fourth metal silicide layer 165.

The first metal silicide layer 161, the second metal silicide layer 162, the fourth metal silicide layer 165, and the fifth metal silicide layer 166 may be self-aligned under the first contact plug 191, the second contact plug 192, the fourth contact plug 195, and the fifth contact plug 196, respectively. The first metal silicide layer 161, the second metal silicide layer 162, the fourth metal silicide layer 165, and the fifth metal silicide layer 166 may be in direct contact with the bottoms and side surfaces of the first contact plug 191, the second contact plug 192, the fourth contact plug 195, and the fifth contact plug 196, respectively. The first barrier layer 171, the second barrier layer 172, the fourth barrier layer 175, and the fifth barrier layer 176 may include, for example, TiN, TaN, or a combination thereof. The first conductive layer 181, the second conductive layer 182, the fourth conductive layer 185, and the fifth conductive layer 186 may include a metal, e.g., W.

Figure 6:
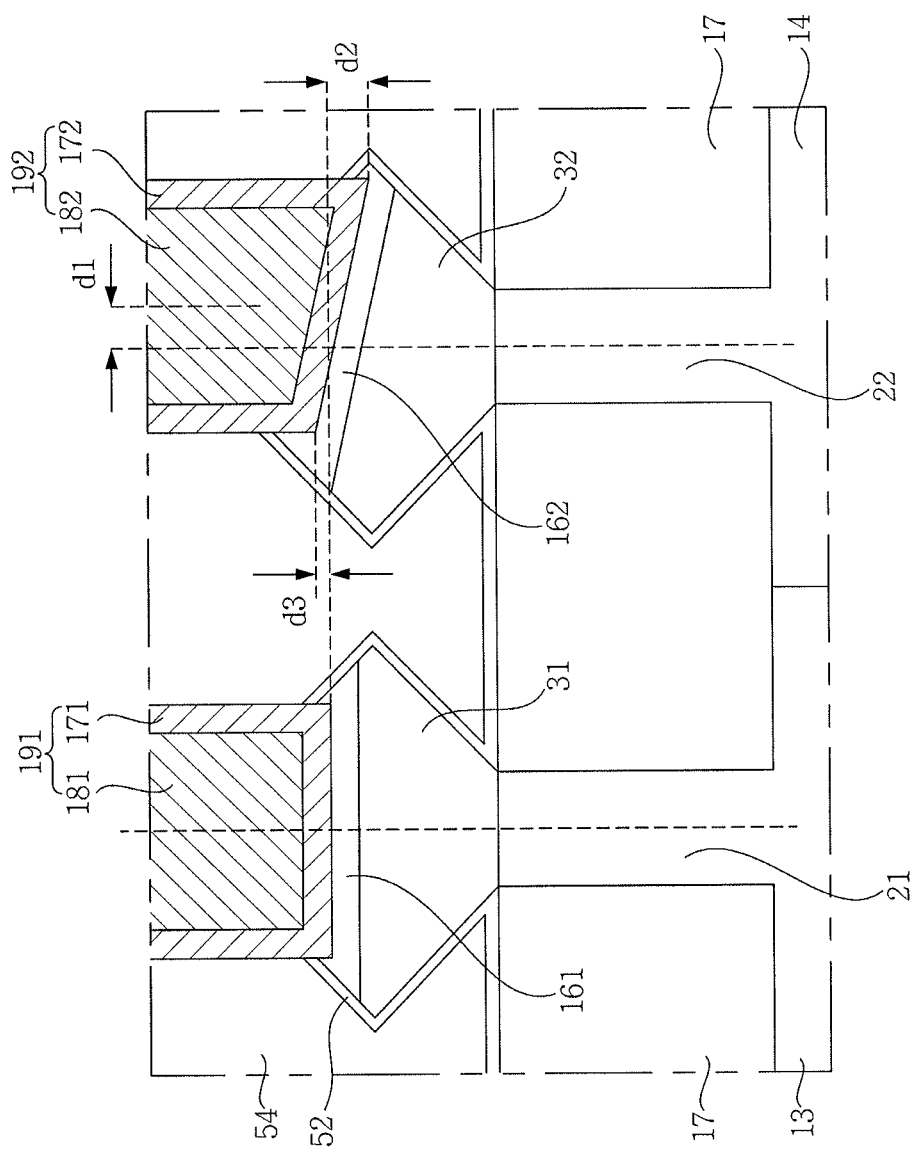
FIG. 6 illustrates an enlarged view of a portion in FIG. 1.

FIG. 6 is a partially enlarged view illustrating a portion of FIG. 1. Referring to FIG. 6, the vertical line passing through the center of the first contact plug 191 may coincide with a vertical line passing through the center of the first source/drain area 31. The vertical line passing through the center of the first contact plug 191 may coincide with the vertical line passing through the center of the first source/drain area 31 and a vertical line passing through a center of the first fin active area 21.

A vertical line passing through the center of the second source/drain area 32 may coincide with a vertical line passing through the center of the second fin active area 22. A vertical line passing through the center of the second contact plug 192 may be spaced apart from the vertical line passing through the center of the second source/drain area 32 by a first distance d1. The vertical line passing through the center of the second contact plug 192 may be spaced apart from the vertical line passing through the center of the second fin active area 22 by the first distance d1.

The lower end of the second contact plug 192 may be at a lower level than the lower end of the first contact plug 191 by a second distance d2. The point at the highest level of the bottom of the second contact plug 192 may be at a higher level than the point at the highest level of the bottom of the first contact plug 191 by a third distance d3.

Figure 7:
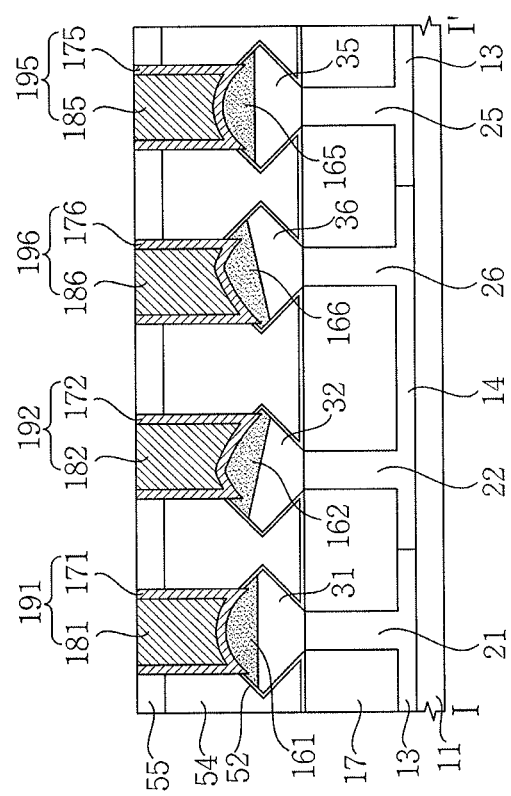
FIG. 7 illustrates another embodiment of a semiconductor device.

FIG. 7 is a cross-sectional view of another embodiment taken along line I-I' of FIG. 4. Referring to FIG. 7, the bottoms of the first contact plug 191, the second contact plug 192, the fourth contact plug 195, and the fifth contact plug 196 may be uneven. The bottoms of the second contact plug 192 and the fifth contact plug 196 may have different shapes from the bottoms of the first contact plug 191 and the fourth contact plug 195. An upper end of the first metal silicide layer 161 may be on the vertical line passing through the center of the first contact plug 191. An upper end of the second metal silicide layer 162 may be offset from the vertical line passing through the center of the second contact plug 192. An upper end of the fourth metal silicide layer 165 may be on the vertical line passing through the center of the fourth contact plug 195. An upper end of the fifth metal silicide layer 166 may be offset from a vertical line passing through the center of the fifth contact plug 196.

FIG. 8 illustrates another layout embodiment of a semiconductor device. FIG. 9 is a cross-sectional view taken along line IV-IV' in FIG. 8. FIG. 10 is a cross-sectional view taken along line V-V' in FIG. 8. FIG. 11 is a cross-sectional view taken along line VI-VI' in FIG. 8.

Referring to FIG. 8, fin active areas, multi-fin active areas, gate electrodes, and contact plugs are formed on a substrate 11 which includes a first cell region C1 and a second cell region C2. The fin active areas include a first fin active area 21, a fourth fin active area 24, a fifth fin active area 25, and eighth fin active area 28.

The multi-fin active areas include a first multi-fin active area 22M, a second multi-fin active area 23M, a third multi-fin active area 26M, and a fourth multi-fin active area 27M. The first multi-fin active area 22M include a pair of parallel sub-fin active areas including a first left sub-fin active area 22A and a first right sub-fin active area 22B. The second multi-fin active area 23M include a pair of parallel sub-fin active areas including a second left sub-fin active area 23A and a second right sub-fin active area 23B. The third multi-fin active area 26M include a pair of parallel sub-fin active areas including a third left sub-fin active area 26A and a third right sub-fin active area 26B. The fourth multi-fin active area 27M include a pair of parallel sub-fin active areas including a fourth left sub-fin active area 27A and a fourth right sub-fin active area 27B.

The gate electrodes include a first gate electrode 43, a second gate electrode 44, a third gate electrode 45, a fourth gate electrode 46, a fifth gate electrode 47, a sixth gate electrode 48, and a seventh gate electrode 49.

The contact plugs include a first contact plug 191, a second contact plug 192, a third contact plug 193, a fourth contact plug 195, a fifth contact plug 196, and a sixth contact plug 197. In another embodiment, each of the multi-fin active areas 22M, 23M, 26M, and 27M may include three or more lower-fin active areas parallel to each other.

Referring to FIG. 9, an N-well 13, a P-well 14, device isolation layers 17 and 17A, the fin active areas 21 and 25, the multi-fin active areas 22M and 26M, source/drain areas 31 and 35, multi-source/drain areas 32A, 32B, 36A, and 36B, an etch-stop layer 52, a lower insulating layer 54, an upper insulating layer 55, metal silicide layers 161, 162, 165, and 166, barrier layers 171, 172, 175, and 176, and conductive layers 181, 182, 185, and 186 are formed on the substrate 11. The barrier layers 171, 172, 175, and 176 and the conductive layers 181, 182, 185, and 186 may configure the contact plugs 191, 192, 195, and 196.

Referring to FIG. 10, the P-well 14, the first left sub-fin active area 22A, a first multi-source/drain area 32A, a lower gate dielectric layer 41, an upper gate dielectric layer 42, a first gate electrode 43, a spacer 51, the etch-stop layer 52, the lower insulating layer 54, the upper insulating layer 55, the metal silicide layer 162, the barrier layer 172, and the conductive layer 182 are formed on the substrate 11.

Referring to FIG. 11, the P-well 14, the device isolation layers 17 and 17A, the first multi-fin active area 22M, the lower gate dielectric layer 41, the upper gate dielectric layer 42, the first gate electrode 43, and the upper insulating layer 55 are formed on the substrate 11.

Referring again to FIGS. 8 to 11, the distance between the first left sub-fin active area 22A and the first right sub-fin active area 22B may be less than the distance between the first fin active area 21 and the first multi-fin active area 22M. The distance between the first multi-fin active area 22M and the third multi-fin active area 26M may be greater than the distance between the first fin active area 21 and the first multi-fin active area 22M.

The device isolation layers 17 and 17A include a first device isolation layer 17 and a second device isolation layer 17A. The second device isolation layer 17A may be between the first left sub-fin active area 22A and the first right sub-fin active area 22B and between the third left sub-fin active area 26A and the third right sub-fin active area 26B. A lower end of the second device isolation layer 17A may be at a higher level than a lower end of the first device isolation layer 17.

The multi-source/drain areas include the first multi-source/drain area 32A, a second multi-source/drain area 32B, a third multi-source/drain area 36A, and a fourth multi-source/drain 36B. The first multi-source/drain area 32A may be on the first left sub-fin active area 22A. The second multi-source/drain area 32B may be on the first right sub-fin active area 22B. The third multi-source/drain 36A may be on the third left sub-fin active area 26A. The fourth multi-source/drain 36B may be on the third right sub-fin active area 26B.

The horizontal width of the first multi-source/drain area 32A may be greater than the horizontal width of the first left sub-fin active area 22A. The horizontal width of the second multi-source/drain area 32B may be greater than the horizontal width of the first right sub-fin active area 22B. A side surface of the first multi-source/drain area 32A may be in contact with a side surface of the second multi-source/drain area 32B. A side surface of the third multi-source/drain area 36A may be in contact with the fourth multi-source/drain 36B.

The second contact plug 192 may be on the first multi-source/drain area 32A and the second multi-source/drain area 32B to be adjacent to the first gate electrode 43. A second metal silicide layer 162 may be between the second contact plug 192 and the first and second multi-source/drain areas 32A and 32B. The center of the second contact plug 192 may be offset from the center of the first multi-fin active area 22M. The center of the second contact plug 192 may be offset from the center of the first multi-source/drain area 32A and a center of the second multi-source/drain area 32B.

The fifth contact plug 196 may be formed on the third multi-source/drain 36A and the fourth multi-source/drain 36B to be adjacent to the fifth gate electrode 47.

FIGS. 12 and 13 are cross-sectional views for describing another embodiment of a semiconductor device. Referring to FIGS. 12 and 13, device isolation layers 17 and 17B include a first device isolation layer 17 and a second device isolation layer 17B. The second device isolation layer 17B may be between a first left sub-fin active area 22A and a first right sub-fin active area 22B and between a third left sub-fin active area 26A and a third right sub-fin active area 26B. A lower end of the second device isolation layer 17B may be substantially at the same level as a lower end of the first device isolation layer 17.

FIG. 14 illustrates another layout embodiment of a semiconductor device, which includes fin active areas, multi-fin active areas, gate electrodes, and contact plugs formed on a substrate 11. The substrate 11 may include a first cell region C1 and a second cell region C2.

The fin active areas include a first fin active area 21, a fourth fin active area 24, a fifth fin active area 25, a sixth fin active area 26, a seventh fin active area 27, and an eighth fin active area 28.

The multi-fin active areas include a first multi-fin active area 22M and a second multi-fin active area 23M. The first multi-fin active area 22M include a pair of parallel sub-fin active areas including a first left sub-fin active area 22A and a first right sub-fin active area 22B. The second multi-fin active area 23M include a pair of parallel sub-fin active areas including a second left sub-fin active area 23A and a second right sub-fin active area 23B.

The gate electrodes include a first gate electrode 43, second gate electrodes 44A and 44B, a third gate electrode 45, a fourth gate electrode 46, a fifth gate electrode 47, a sixth gate electrode 48, and a seventh gate electrode 49.

The contact plugs include a first contact plug 191, a second contact plug 192, a third contact plug 193, a fourth contact plug 195, a fifth contact plug 196, and a sixth contact plug 197. The second gate electrodes include a left gate electrode 44A and right gate electrode 44B. The left gate electrode 44A and the right gate electrode 44B may be integrated. In another embodiment, the left gate electrode 44A and the right gate electrode 44B may be separated.

FIG. 15 is a layout corresponding to an embodiment of a main process of a method for forming a semiconductor device. FIG. 16 is a cross-sectional view taken along line I-I' in FIG. 15. FIG. 17 is a cross-sectional view taken along line II-II' in FIG. 15. FIG. 18 is a cross-sectional view taken along line III-III' in FIG. 15. Referring to FIGS. 15 to 18, an N-well 13, a P-well 14, a device isolation layer 17, and fin active areas 21, 22, 23, 24, 25, 26, 27, and 28 may be formed in a substrate 11. The fin active areas 21, 22, 23, 24, 25, 26, 27, and 28 may protrude to a higher level than the device isolation layer 17. Each of the fin active areas 21, 22, 23, 24, 25, 26, 27, and 28 may have a vertical height greater than a horizontal width.

FIG. 19 is a layout corresponding to another embodiment of a main process of the method for forming a semiconductor device. FIGS. 20 and 23 are cross-sectional views taken along line I-I' in FIG. 19. FIGS. 21 and 24 are cross-sectional views taken along line II-II' in FIG. 19. FIG. 22 is a cross-sectional view taken along line III-III' in FIG. 19.

Referring to FIGS. 19 to 22, source/drain areas, a lower gate dielectric layer 41, an upper gate dielectric layer 42, gate electrodes 43, 44, 45, 46, 47, 48, and 49, a spacer 51, an etch-stop layer 52, and a lower insulating layer 54 may be formed. The source/drain areas include a first source/drain area 31, a second source/drain area 32, a third source/drain area 35, and a fourth source/drain area 36. The first source/drain area 31 and the third source/drain area 35 may be formed through a different process from the second source/drain area 32 and the fourth source/drain area 36. The first source/drain area 31 and the third source/drain area 35 may include a different material from the second source/drain area 32 and the fourth source/drain area 36.

Referring to FIGS. 19, 23, and 24, an upper insulating layer 55 and contact holes 151, 152, 155, and 156 may be formed. The contact holes 151, 152, 155, and 156 pass through the upper insulating layer 55, the lower insulating layer 54, and the etch-stop layer 52 to expose the source/drain areas 31, 32, 35, and 36.

Referring again to FIGS. 1 to 4, metal silicide layers 161, 162, 165, and 166 may be formed on the source/drain areas 31, 32, 35, and 36 exposed in the contact holes 151, 152, 155, and 156. Contact plugs 191, 192, 195, and 196 filling the contact holes 151, 152, 155, and 156 may be formed on the metal silicide layers 161, 162, 165, and 166.

Figure 27:
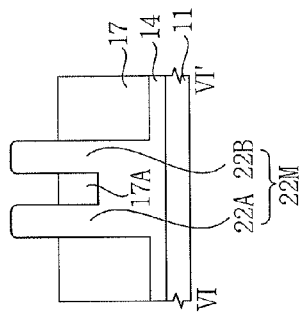
Figure 26:
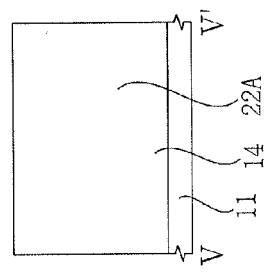
Figure 25:
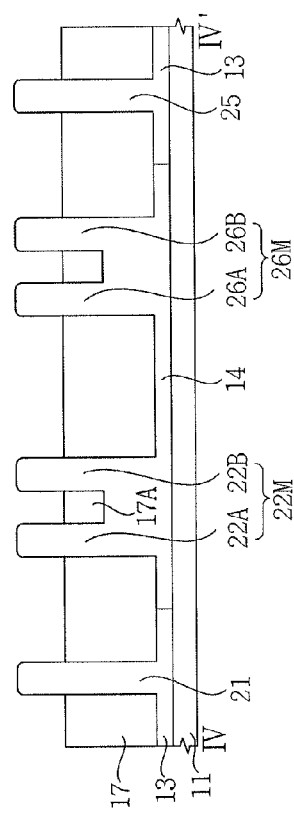
Figure 30:
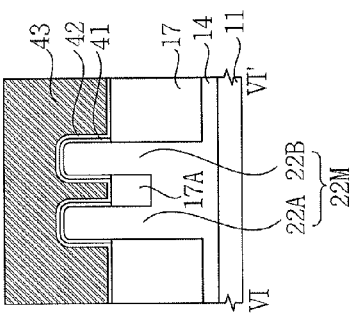
Figure 29:
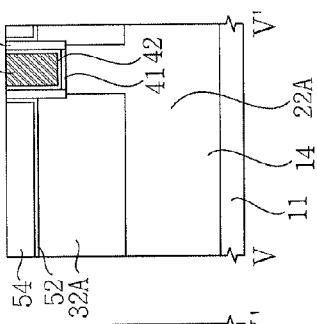
Figure 28:
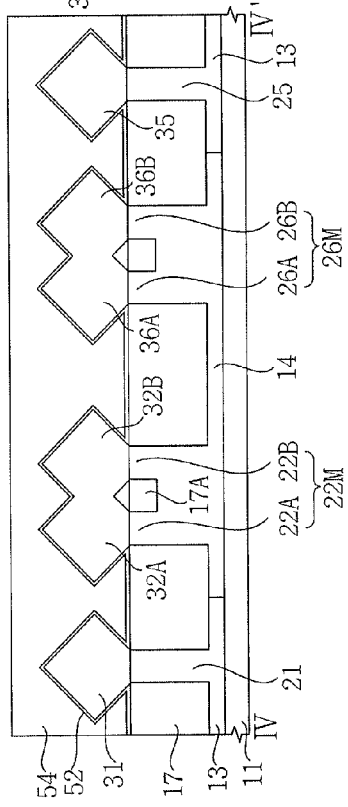

FIGS. 25, 28, and 31 are cross-sectional views taken along line IV-IV' in FIG. 8 which correspond to another embodiment of a method of forming a semiconductor device. FIGS. 26, 29, and 32 are cross-sectional views taken along line V-V' in FIG. 8. FIGS. 27 and 30 are cross-sectional view taken along line VI-VI' in FIG. 8.

Referring to FIGS. 8 and 25 to 27, an N-well 13, a P-well 14, device isolation layers 17 and 17A, fin active areas 21, 24, 25, and 28, and multi-fin active areas are formed in a substrate 11.

The multi-fin active areas include a first multi-fin active area 22M a second multi-fin active area 23M, a third multi-fin active area 26M, and a fourth multi-fin active area 27M. The first multi-fin active area 22M includes a pair of parallel sub-fin active areas including a first left sub-fin active area 22A and a first right sub-fin active area 22B. The second multi-fin active area 23M include a pair of parallel sub-fin active areas including a second left sub-fin active area 23A and a second right sub-fin active area 23B. The third multi-fin active area 26M include a pair of parallel sub-fin active areas including a third left sub-fin active area 26A and a third right sub-fin active area 26B. The fourth multi-fin active area 27M include a pair of parallel sub-fin active areas including a fourth left sub-fin active area 27A and a fourth right sub-fin active area 27B.

Referring to FIGS. 8 and 28 to 30, source/drain areas 31 and 35, multi-source/drain areas 32A, 32B, 36A, and 36B, a lower gate dielectric layer 41, an upper gate dielectric layer 42, gate electrodes 43, 44, 45, 46, 47, 48, and 49, a spacer 51, an etch-stop layer 52, and a lower insulating layer 54 may be formed.

Referring to FIGS. 8, 31, and 32, an upper insulating layer 55 and contact holes 151, 152, 155, and 156 may be formed.

Referring again to FIGS. 8 to 11, metal silicide layers 161, 162, 165, and 166 and contact plugs 191, 192, 195, and 196 may be formed.

Figure 34:
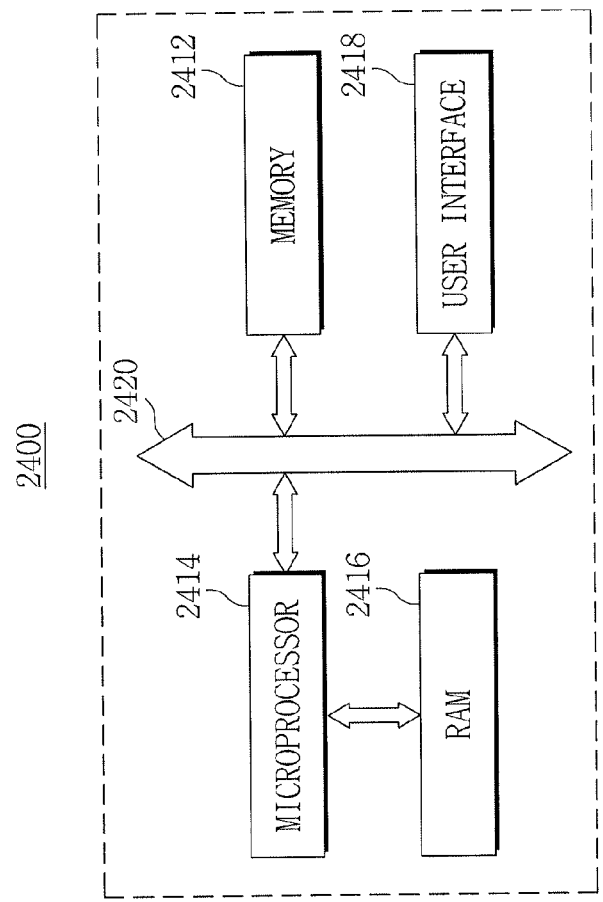
FIGS. 33-34 illustrate embodiments of electronic apparatuses.
Figure 33:
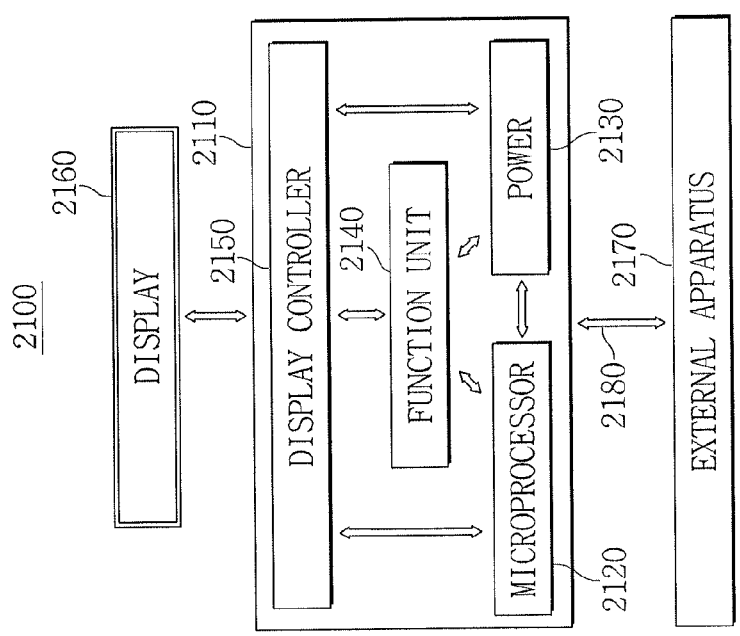

FIGS. 33 and 34 illustrate embodiments of electronic apparatuses.

Referring to FIG. 33, the semiconductor device embodiments described with reference to FIGS. 1 to 32 may be applied to an electronic system 2100. The electronic system 2100 includes a body 2110, a microprocessor 2120, a power unit 2130, a function unit 2140, and a display controller 2150. The body 2110 may be a motherboard formed of a printed circuit board (PCB). The microprocessor 2120, the power unit 2130, the function unit 2140, and the display controller 2150 may be installed on the body 2110. A display 2160 may be inside or outside the body 2110. For example, the display 2160 may be on a surface of the body 2110 to display an image processed by the display controller 2150.

The power unit 2130 may receive a constant voltage from an external battery or other power source, divide the voltage into various levels of required voltages, and supply those voltages to the microprocessor 2120, the function unit 2140, and the display controller 2150. The microprocessor 2120 may receive a voltage from the power unit 2130 to control the function unit 2140 and the display 2160. The function unit 2140 may perform various functions of the electronic system 2100. For example, when the electronic system 2100 is a smartphone, the function unit 2140 may have several components which perform functions of a mobile phone (such as output of an image to the display 2160 or output of a voice to a speaker) by dialing or communication with an external apparatus 2170. When a camera is installed, the function unit 2140 may function as a camera image processor.

In one embodiment, when the electronic system 2100 is connected to a memory card, for example, in order to expand the capacity thereof, the function unit 2140 may be a memory card controller. The function unit 2140 may exchange signals with the external apparatus 2170 through a wired or wireless communication unit 2180. When the electronic system 2100 uses a Universal Serial Bus (USB), for example, in order to expand functionality, the function unit 2140 may function as an interface controller. Further, the function unit 2140 may include a mass storage apparatus.

The semiconductor device described with reference to FIGS. 1 to 32 may be applied to the function unit 2140 or the microprocessor 2120.

Referring to FIG. 34, an electronic system 2400 includes at least one of the aforementioned embodiments of a semiconductor device. The electronic system 2400 may be used for a mobile apparatus or computer. For example, the electronic system 2400 may include a memory system 2412, a microprocessor 2414, a random access memory (RAM) 2416, a bus 2420, and a user interface 2418. The microprocessor 2414, the memory system 2412, and the user interface 2418 may be interconnected via the bus 2420. The user interface 2418 may be used to input data to or output data from the electronic system 2400. The microprocessor 2414 may program and control the electronic system 2400. The RAM 2416 may be used as an operational memory of the microprocessor 2414. The microprocessor 2414, the RAM 2416, and/or other components may be assembled in a single package. The memory system 2412 may store codes for operating the microprocessor 2414, data processed by the microprocessor 2414, or external input data. The memory system 2412 may include a controller and a memory device.

The semiconductor device described with reference to FIGS. 1 to 32 may be applied to the microprocessor 2414, the RAM 2416, and the memory system 2412.

In accordance with one or more of the aforementioned embodiments, a first contact plug and a second contact plug may be respectively formed on first and second source/drain areas. The center of the second contact plug is offset from the center of the second source/drain area. Also, the bottom of the second contact plug may have a different inclination from the bottom of the first contact plug. Also, the distance between the vertical center of the first contact plug and the vertical center of the second contact plug may be greater than the distance between the vertical center of the first source/drain area and the vertical center of the second source/drain area. Accordingly, the formation of bridges between the first and second contact plugs may be prevented. In addition, a semiconductor device suitable for high integration applications and with excellent electrical properties may be implemented.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A semiconductor device, comprising:
   a first fin active area;
   a second fin active area substantially parallel to the first fin active area;
   a first source/drain in the first fin active area;
   a second source/drain in the second fin active area;
   a first contact plug on the first source/drain; and
   a second contact plug on the second source/drain, wherein the second contact plug is only on one source/drain corresponding to the second source/drain and wherein a center of the second contact plug is offset from a center of the second source/drain.

2. The semiconductor device as claimed in claim 1, wherein a bottom of the second contact plug has a different inclination from a bottom of the first contact plug.

3. The semiconductor device as claimed in claim 1, further comprising:
   an inclined interface between the second contact plug and the second source/drain, the inclined interface at a higher level in a direction approaching the first fin active area and at a lower level in a direction away from the first fin active area.

4. The semiconductor device as claimed in claim 1, wherein a distance between a vertical center of the first contact plug and a vertical center of the second contact plug is greater than a distance between a vertical center of the first source/drain and a vertical center of the second source/drain.

5. The semiconductor device as claimed in claim 1, wherein a lower end of the second contact plug is at a lower level than a lower end of the first contact plug.

6. The semiconductor device as claimed in claim 1, wherein:
a horizontal width of the first source/drain is greater than a horizontal width of the first fin active area, and
a horizontal width of the second source/drain is greater than a horizontal width of the second fin active area.

7. The semiconductor device as claimed in claim 1, wherein a farthest point of an interface between the second contact plug and the second source/drain from a vertical line passing through a center of the first source/drain is at a lower level than a closest point of the interface between the second contact plug and the second source/drain to the vertical line passing through the center of the first source/drain.

8. The semiconductor device as claimed in claim 1, further comprising:
a third fin active area substantially parallel to the second fin active area;
a third source/drain in the third fin active area; and
a third contact plug on the third source/drain, wherein the second fin active area is between the first fin active area and the third fin active area, and wherein a center of the third contact plug is offset from a center of the third source/drain.

9. A semiconductor device, comprising:
first and second pull-up transistors;
first and second pull-down transistors;
first and second access transistors;
a first contact plug adjacent to the second pull-up transistor; and
a second contact plug adjacent to the second pull-down transistor, wherein a first source/drain in a first fin active area of the second pull-up transistor is connected to the first contact plug, a second source/drain in a second fin active area of the second pull-down transistor is connected to the second contact plug, and a center of the second contact plug is offset from a center of the second source/drain.

10. The semiconductor device as claimed in claim 9, wherein the second fin active area is substantially parallel to the first fin active area.

11. The semiconductor device as claimed in claim 9, wherein:
the first source/drain includes P-type impurities, and
the second source/drain includes N-type impurities.

12. The semiconductor device as claimed in claim 9, wherein:
the first source/drain includes a crystal-growth SiGe layer, and
the second source/drain includes a crystal-growth Si layer, a crystal-growth SiC layer, or a combination thereof.

13. The semiconductor device as claimed in claim 9, a distance between a vertical center of the first contact plug and a vertical center of the second contact plug is greater than a distance between a vertical center of the first source/drain and a vertical center of the second source/drain.

14. The semiconductor device as claimed in claim 9, further comprising:
a third contact plug adjacent to the first pull-down transistor,
wherein a third source/drain in a third fin active area of the first pull-down transistor is connected to the third contact plug, and a center of the third contact plug is offset from a center of the third source/drain.

15. A semiconductor device, comprising:
a first source/drain area;
a second source/drain area;
a first contact plug on the first source/drain area; and
a second contact plug on the second source/drain area, wherein a center of the second contact plug is offset from a center of the second source/drain, wherein a farthest point of an interface between the second contact plug and the second source/drain area from a vertical line passing through the center of the first source/drain area is at a lower level than a closest point of the interface between the second contact plug and the second source/drain area to the vertical line passing through the center of the first source/drain area.

16. The semiconductor device as claimed in claim 15, wherein the first contact plug is adjacent the second contact plug.

17. The semiconductor device as claimed in claim 15, wherein:
the center of the first contact plug is spaced from the center of the second contact plug by a first distance;
the center of the first source/drain area is spaced from the center of the second source/drain area by a second distance; and
the first distance is greater than the second distance.

18. The semiconductor device as claimed in claim 15, wherein a lower surface of the second contact plug is inclined.

19. The semiconductor device as claimed in claim 15, wherein:
a lower surface of the first contact plug has a first shape;
a lower surface of the second contact plug has a second shape; and
the first shape is different from the second shape.

20. The semiconductor device as claimed in claim 15, further comprising:
a third source/drain area; and
a third contact plug on the third source/drain area,
wherein the second source/drain area is between the first source/drain area and the third source/drain area, and a center of the third contact plug is offset from a center of the third source/drain area.

* * * * *